(12) United States Patent
Joo et al.

(10) Patent No.: US 7,103,126 B2
(45) Date of Patent: Sep. 5, 2006

(54) METHOD AND CIRCUIT FOR ADJUSTING THE TIMING OF OUTPUT DATA BASED ON THE CURRENT AND FUTURE STATES OF THE OUTPUT DATA

(75) Inventors: Yangsung Joo, Boise, ID (US); Greg A. Blodgett, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 800 days.

(21) Appl. No.: 10/051,483

(22) Filed: Jan. 17, 2002

(65) Prior Publication Data

US 2003/0133527 A1    Jul. 17, 2003

(51) Int. Cl.
*H04L 7/00* (2006.01)
*H04L 7/02* (2006.01)

(52) U.S. Cl. .................. 375/354; 375/355; 375/356
(58) Field of Classification Search ............... 375/356, 375/355, 364, 371, 146, 295
See application file for complete search history.

(56) References Cited

U.S. PATENT DOCUMENTS

| 4,019,153 | A  | * | 4/1977 | Cox et al. ................. 331/1 A |
| 5,197,082 | A  | * | 3/1993 | Uda et al. .................. 375/214 |
| 5,949,260 | A  | * | 9/1999 | Toda ........................ 327/149 |
| 5,973,525 | A  | * | 10/1999 | Fujii ......................... 327/158 |
| 6,157,229 | A  | * | 12/2000 | Yoshikawa .................. 327/149 |
| 6,172,537 | B1 | * | 1/2001 | Kanou et al. ................. 327/99 |
| 6,173,432 | B1 | * | 1/2001 | Harrison ........................ 716/1 |
| 6,194,932 | B1 | * | 2/2001 | Takemae et al. ............ 327/158 |
| 6,195,759 | B1 |   | 2/2001 | Salmon ...................... 713/600 |
| 6,239,635 | B1 | * | 5/2001 | Matsuzaki ................... 327/160 |
| 6,286,072 | B1 | * | 9/2001 | Bredin et al. ................ 710/305 |
| 6,373,303 | B1 | * | 4/2002 | Akita .......................... 327/156 |
| 6,374,360 | B1 | * | 4/2002 | Keeth et al. ................. 713/400 |
| 6,426,900 | B1 | * | 7/2002 | Maruyama et al. .......... 365/194 |
| 6,476,653 | B1 | * | 11/2002 | Matsuzaki ................... 327/158 |
| 6,484,268 | B1 | * | 11/2002 | Tamura et al. .............. 713/600 |
| 6,629,250 | B1 |   | 9/2003 | Kopser et al. .............. 713/401 |
| 6,636,932 | B1 | * | 10/2003 | Regev et al. ................ 710/317 |
| 6,693,472 | B1 | * | 2/2004 | Mikhalev et al. ........... 327/149 |
| 6,792,516 | B1 |   | 9/2004 | Mastronarde et al. ....... 711/158 |
| 6,836,166 | B1 | * | 12/2004 | Lin et al. .................... 327/158 |
| 6,839,301 | B1 | * | 1/2005 | Lin et al. .................... 365/233 |
| 6,857,080 | B1 | * | 2/2005 | Liang ......................... 713/401 |
| 6,889,336 | B1 | * | 5/2005 | Schoenfeld et al. ........ 713/503 |
| 2001/0043097 | A1 | * | 11/2001 | Akita ........................ 327/156 |
| 2002/0017939 | A1 | * | 2/2002 | Okuda et al. ............... 327/296 |
| 2002/0078294 | A1 | * | 6/2002 | Tsuchida et al. ............ 711/105 |
| 2002/0180500 | A1 | * | 12/2002 | Okuda et al. ............... 327/158 |
| 2003/0067331 | A1 | * | 4/2003 | Drexler ....................... 327/158 |

* cited by examiner

*Primary Examiner*—Chieh M. Fan
*Assistant Examiner*—Jason M. Perilla
(74) *Attorney, Agent, or Firm*—Dorsey & Whitney LLP

(57) ABSTRACT

A clock synchronization circuit receives an input clock signal along with current and future data signals. The clock synchronization circuit generates a phase shifted clock signal in response to the input clock signal, with the phase shifted clock signal having a phase shift relative to the input clock signal that is a function of the current and future data signals. The clock synchronization circuit may also generate a plurality of phase shifted clock signals, with each phase shifted clock signal having a respective phase shift that is a function of the current and future logic states of groups of the other data signals.

54 Claims, 10 Drawing Sheets

METHOD AND CIRCUIT FOR ADJUSTING THE TIMING OF OUTPUT DATA BASED ON THE CURRENT AND FUTURE STATES OF THE OUTPUT DATA

TECHNICAL FIELD

The present invention relates generally to integrated circuits, and more specifically to synchronizing an external clock signal applied to an integrated circuit with data signals being output from the integrated circuit.

BACKGROUND OF THE INVENTION

In synchronous integrated circuits, the integrated circuit is clocked by an external clock signal and performs operations at predetermined times relative the rising and falling edges of the applied clock signal. Examples of synchronous integrated circuits include synchronous memory devices such as synchronous dynamic random access memories (SDRAMs), synchronous static random access memories (SSRAMs), and packetized memories like SLDRAMs and RDRAMs, and include other types of integrated circuits as well, such as microprocessors. The timing of signals external to a synchronous memory device is determined by the external clock signal, and operations within the memory device typically must be synchronized to external operations. For example, the synchronous memory device latches internal data words from an internal data bus into latches in synchronism with the external clock signal, and data is driven from these latches to an external data bus and an external circuit, such as a memory controller, must latch these data words at the proper times to successfully capture each data word. To latch the internal data words, an internal clock signal is developed in response to the external clock signal, and is typically applied to storage circuits such as latches contained in the memory device to thereby clock the internal data words into the latches. The internal clock signal and external clock must be synchronized to ensure the internal clock signal clocks the latches at the proper times to successfully capture the internal data words. In the present description, "external" is used to refer to signals and operations outside of the memory device, and "internal" to refer to signals and operations within the memory device. Moreover, although the present description is directed to synchronous memory devices, the principles described herein are equally applicable to other types of synchronous integrated circuits.

Internal circuitry in the memory device that generates the internal clock signal necessarily introduces some time delay or advance, causing the internal clock signal to be phase shifted relative to the external clock signal. To increase the rate at which commands can be applied to the memory device and at which data can be transferred to and from the memory device, the frequency of the external clock signal is increased, and in modern synchronous memories the frequency is in excess of 100 MHZ. As the frequency of the external clock signal increases, however, the time delay introduced by the internal circuitry becomes more significant. This is true because as the frequency of the external clock signal increases, the period of the signal decreases and thus even small delays introduced by the internal circuitry correspond to significant phase shifts between the internal and external clock signals.

To synchronize external and internal clock signals in modern synchronous memory devices, a number of different clock synchronization circuits have been considered and utilized, including delay-locked loops (DLLs), phased-locked loops (PLLs), and synchronous mirror delays (SMDs). Note that as used herein, the term synchronized includes signals that are coincident and signals that have a desired phase shift relative to one another. Some clock synchronization circuits provide a fixed phase shift of the internal clock signal relative to the external signal and thereafter adjust this phase shift as a function of temperature and/or voltage. Other clock synchronization circuits have fuses that may be selectively programmed to establish a desired phase shift, or include components that may be trimmed to obtain the desired phase shift.

FIG. 1 is a functional block diagram illustrating a data output circuit 100 including a conventional clock synchronization circuit 102 that generates a synchronous phase shifted clock signal CLKDEL in response to an external clock signal CLK, and applies the CLKDEL signal to latch read data signals RD1–RDN into a plurality of data drivers 104A–N, as will now be explained in more detail. The clock synchronization circuit 102 may be any of the conventional circuits previously described, such as a DLL. The data output circuit 100 corresponds to circuitry in a typical synchronous memory device that clocks read data out of the memory device in synchronism with the CLK signal. The data drivers 104A–N receive the RD1–RDN signals, respectively, and each data driver latches the received RD1–RDN signal in response to being clocked by the CLKDEL signal and outputs the latched RD1–RDN signal as a corresponding data signal DQ1–DQN. The DQ1–DQN signals collectively form a data bus DQ of the memory device containing the data output circuit 100. In operation, the clock synchronization circuit 102 applies the CLKDEL signal to clock the RD1–RDN signals out of the data drivers 104A–N as the DQ1–DQN signals. The CLKDEL signal has a time delay TD relative to the CLK signal that causes the DQ1–DQN signals to be output from the data drivers 104A–N in synchronism with the CLK signal, as will be appreciated by those skilled in the art. Instead of viewing the CLKDEL signal as being delayed relative to the CLK signal, the CLKDEL signal may be viewed as having a phase shift relative to the CLK signal, and depending on the specific type of clock synchronization circuit 102 the CLKDEL signal may be delayed or advanced relative to the CLK signal, as will also be appreciated by those skilled in the art. The term phase shift includes both advanced and delayed CLKDEL signals relative to the CLK signal.

In a typical synchronous memory device containing the data output circuit 100, a timing parameter known as an access time TAC is specified for the memory device. The access time TAC defines a timing window around the transition of the CLK signal that defines when the transitions of the DQ1–DQN signals must occur in order to allow a memory controller to successfully capture the DQ1–DQN signals in response to the CLK signal. Typically, the access time TAC is defined as two separate parameters, a minimum access time TAC (MIN) and a maximum access time TAC, that define the maximum time before and after, respectively, the transition of the CLK signal that the transition of the DQ1–DQN signals must occur. Thus, the clock synchronization circuit 102 must operate to generate the CLKDEL signal having the time delay TD that causes the DQ1–DQN signals to satisfy the specified access time TAC parameters of the memory device containing the data output circuit 100. As long as the transitions of the DQ1–DQN signals occur within the specified access times, the DQ1–DQN signals are synchronized with the CLK signal.

In modern synchronous memory devices, the frequency of the CLK signal is steadily increasing to increase the rate at which data may be transferred to and from the memory device. As the frequency of the CLK signal increases, the access time TAC decreases, as will be appreciated by those skilled in the art. As a result, the CLKDEL signal must have the proper time delay TD relative to the CLK signal in order to clock the DQ1–DQN signals out of the data drivers 104A–N within the reduced timing window defined by the reduced access time TAC. While conventional clock synchronization circuits 102 such as DLLs can generate the CLKDEL signal having the required time delay TD, any change in the operating characteristics of the data drivers 104A–N may result in an undesirable shift in the timing of the DQ1–DQN signals relative to the CLK signal, as will be understood by those skilled in the art. For example, where the clock synchronization circuit 102 is a DLL, the DLL includes a model delay component that models a delay D introduced by the data drivers 104A–N. The delay D of each data driver 104A–N is the delay between the DQ1–DQN signal and the CLKDEL signal, and corresponds to the delay between when the data driver is clocked by the CLKDEL signal and when the clocked RD1–RDN signal is output as the corresponding DQ1–DQN signal. Differences in the actual delay D of the data drivers 104A–N and the delay corresponding to the model delay may result in the DQ1–DQN signals being output outside of the permitted window defined by the specified access time TAC.

In modern synchronous memory devices, a width N of the data bus DQ, which is determined by the number N of DQ1–DQN signals, is being increased to transfer more data to and from the memory device each cycle of the CLK signal. This increase in the width N of the data bus DQ may change the delay D introduced by the data drivers 104A–N and thereby undesirably shift the DQ1–DQN signals, as will now be explained in more detail. As illustrated in FIG. 1, a first supply voltage source VCCQ is coupled to the data drivers 104A–N through a power line 106 and a second supply voltage source VSSQ is coupled to the data drivers through a power line 108. As the width N of the data bus DQ increases, more data drivers 104A–N are coupled to the voltage sources VCCQ, VSSQ. The greater number of data drivers 104A–N increases the current through the power lines 106,108 when the data drivers 104A–N must drive the corresponding DQ1–DQN signal to an opposite voltage level corresponding to a complementary logic state. For example, when the current DQ1 signal from the data driver 104A is low and the RD1 signal corresponding to the next or upcoming DQ1 signal to be output from the data driver is high, the data driver draws current through the power line 106 to drive the DQ1 signal high when clocked by the CLKDEL signal.

As the width of N of the data bus DQ increases, more data drivers 104A–N may need to drive the corresponding DQ1–DQN signal from a first logic state to the complementary logic state when clocked by the CLKDEL signal. In this situation, the required current through the power lines 106, 108 may be relatively high and may affect the delay D introduced by the data drivers 104A–N. For example, the maximum current that may be provided by each of the supply voltage sources VCCQ, VSSQ may be less than the maximum current required when all of the data drivers 104A–N must drive the corresponding DQ1–DQN signal from a first logic state to a complementary logic state. As a result, each data driver 104A–N receives less current than required to drive the corresponding DQ1–DQN signal to the complementary logic state according to the specified operating characteristics of the data driver. This reduced current causes the data drivers 104A–N to drive the corresponding DQ1–DQN signals to the complementary logic state more slowly and thereby increases the delay D introduced by each data driver. Similarly, physical constraints on the size of the power lines 106, 108 may result in the power lines having a resistance that causes a relatively large voltage drop to develop across the power lines when the data drivers 104A–N demand the maximum current due to all the data drivers driving the corresponding DQ1–DQN signal from a first logic state to a complementary logic state. Such a voltage drop may cause the data drivers 104A–N to drive the DQ1–DQN signals to the complementary logic state more slowly and thereby increase the delay D of the data drivers.

FIG. 2 illustrates the effect of the increased delay D of the data drivers 104A–N on the operation of the data output circuit 100. At a time T0, the CLKDEL signal goes high and the CLK signal goes high later at a time T1. The CLKDEL signal goes high at time T0 before the CLK signal at time T1 to compensate for the delays D of the data drivers 104A–N, as will be appreciated by those skilled in the art. A first signal timing diagram illustrates a situation where only one of the DQ1–DQN signals transitions from a first logic state to a complementary logic state in response to the CLKDEL signal. In this situation, the DQ1–DQN signals transition at a time T2 which occurs a delay D1 after the transition of the CLKDEL signal at the time T1, where the delay D1 corresponds to the delays of the data drivers 104A–N in this situation. Note that this transition of the DQ1–DQN signals at the time T2 occurs within a specified access time TAC defined between the time T1 and a time T3.

A second signal timing diagram illustrates a situation where half the DQ1–DQN signals transitions from a first logic state to a complementary logic state in response to the CLKDEL signal. In this situation, the DQ1–DQN signals transition at a time T4 which occurs a delay D2 after the transition of the CLKDEL signal at the time T0, where the delay D2 corresponds to the delays of the data drivers 104A–N in this situation. Note that this transition of the DQ1–DQN at the time T4 also occurs within the access time TAC defined between the times T0–T3 as required. A third signal timing diagram illustrates a situation where all the DQ1–DQN signals transition from a first logic state to a complementary logic state in response to the CLKDEL signal. In this situation, the DQ1–DQN signals transition at a time T5 which occurs a delay D3 after the transition of the CLKDEL signal at the time T0, where the delay D3 corresponds to the delays of the data drivers 104A–N in this situation. Note that this transition of the DQ1–DQN at the time T5 occurs outside the access time TAC defined between the times T0–T3 and thus does not satisfy the specified access time parameter of the memory device containing the circuit 100, which is impermissible and may result in invalid data being captured by a memory controller coupled to the memory device. Thus, in the conventional data output circuit 100, when the width N of the data bus DQ becomes large and all DQ1–DQN signals on this data bus transition from a first logic state to a complementary logic state, the transition of the DQ1–DQN signals may not occur within the specified access time TAC.

There is a need for a data output circuit that provides data signals in synchronism with an applied external clock signal in wide data bus synchronous memory devices.

SUMMARY OF THE INVENTION

According to one aspect of the present invention, a clock synchronization circuit receives an input clock signal along with current and future data signals. The clock synchronization circuit generates a phase shifted clock signal in response to the input clock signal, with the phase shifted clock signal having a phase shift relative to the input clock signal that is a function of the current and future data signals.

According to another aspect of the present invention, a data output circuit includes a plurality of data drivers, each data driver receiving a read data signal, and latching the read data signal in response to a phase shifted clock signal. The latched read data signal is then output as a corresponding output data signal. A clock synchronization circuit receives an input clock signal and receives the read data signals. The clock synchronization circuit generates a plurality of phase shifted clock signals in response to the input clock signal. Each phase shifted clock signal is applied to a corresponding data driver to clock the corresponding read data signal out of the data driver as the corresponding output data signal. Each phase shifted clock signal has a respective phase shift relative to the input clock signal that is a function of the other read data and output data signals.

DETAILED DESCRIPTION OF THE INVENTION

Figure 1:
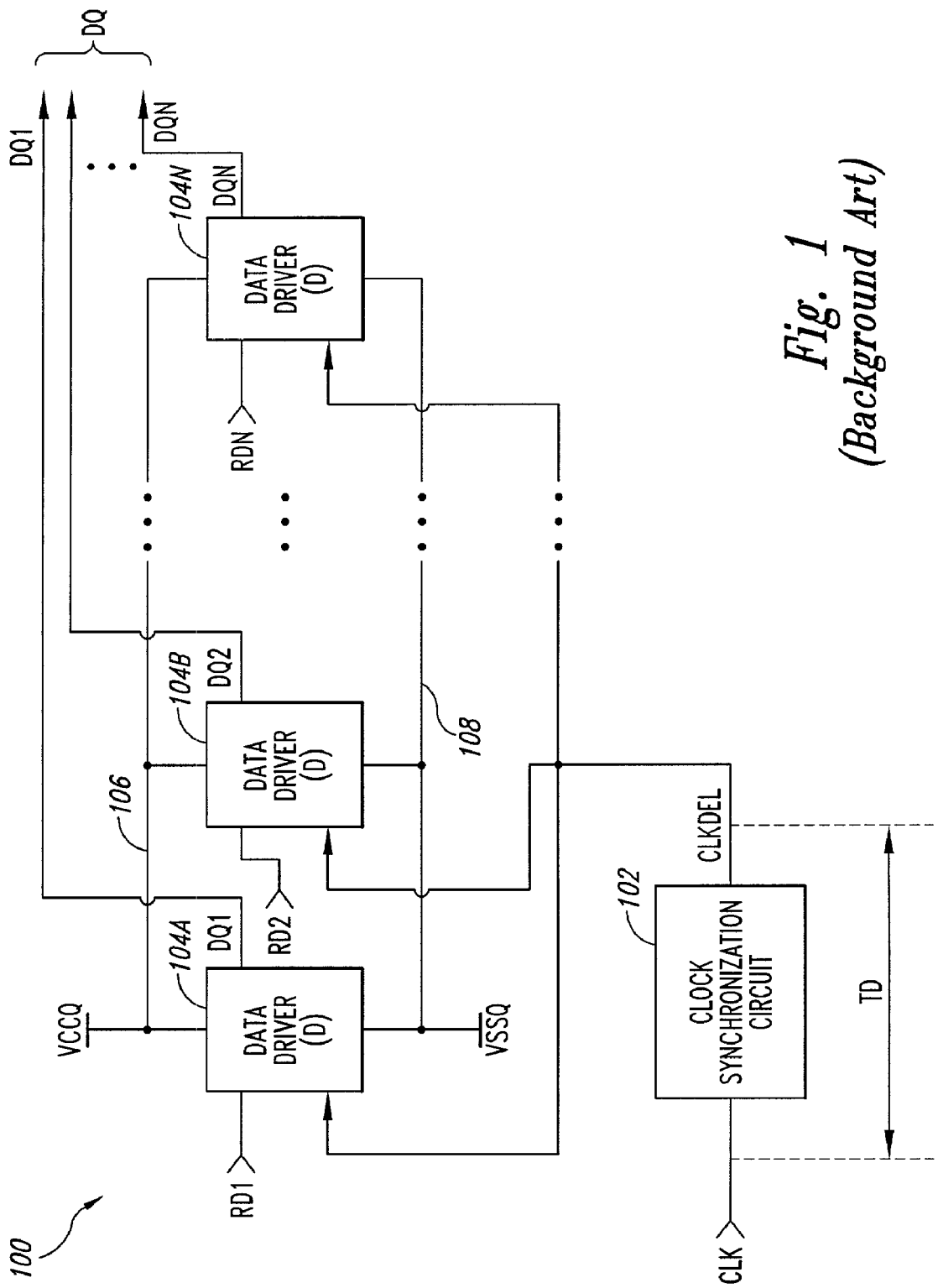
FIG. 1 is a functional block diagram illustrating a data output circuit including a conventional clock synchronization circuit for clocking read data onto a data bus in synchronism with an external clock signal.
Figure 2:
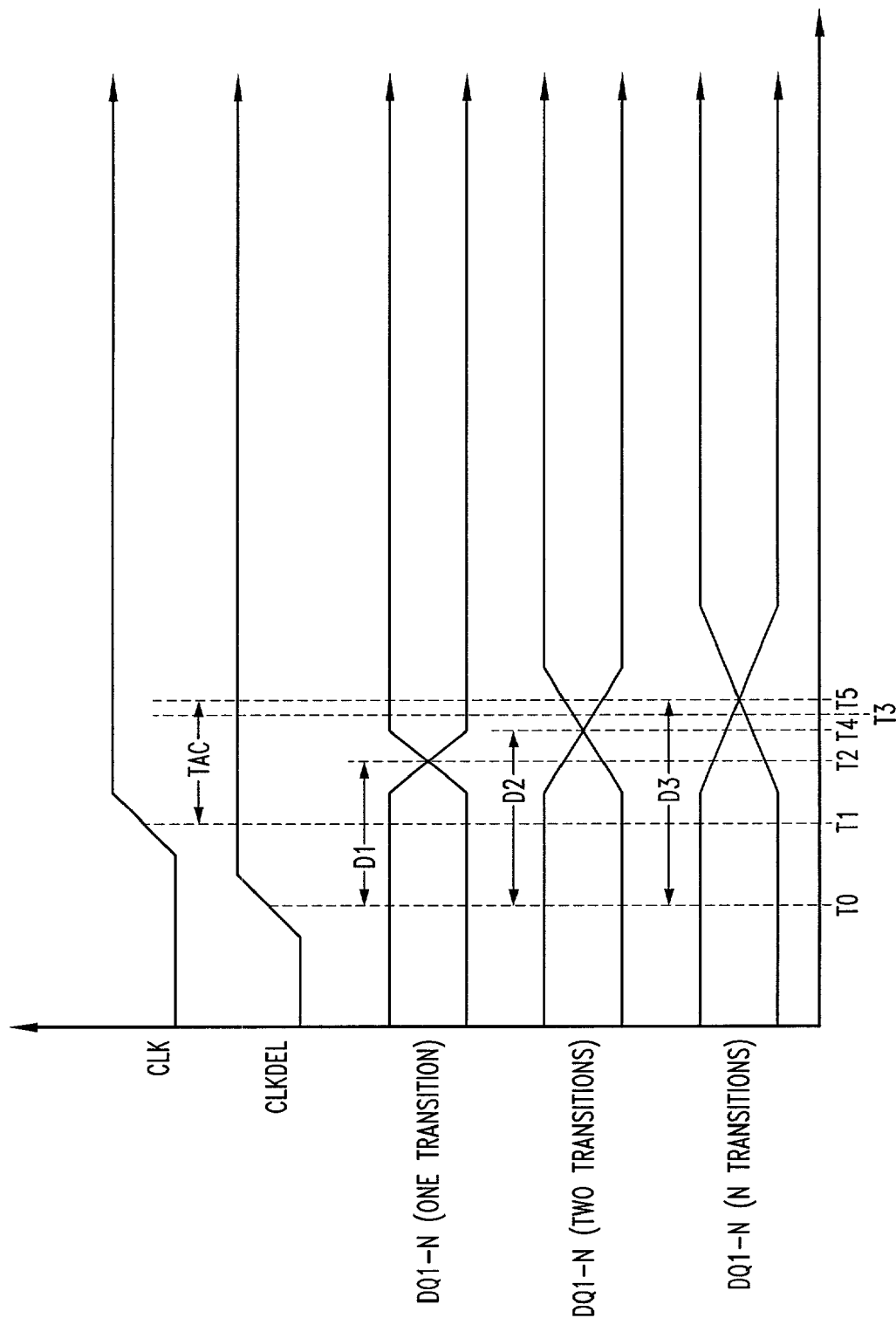
FIG. 2 is a signal timing diagram illustrating shifts in the read data relative to the external clock signal as the number of bits transitioning increases during operation of the data output circuit of FIG. 1.
Figure 3:
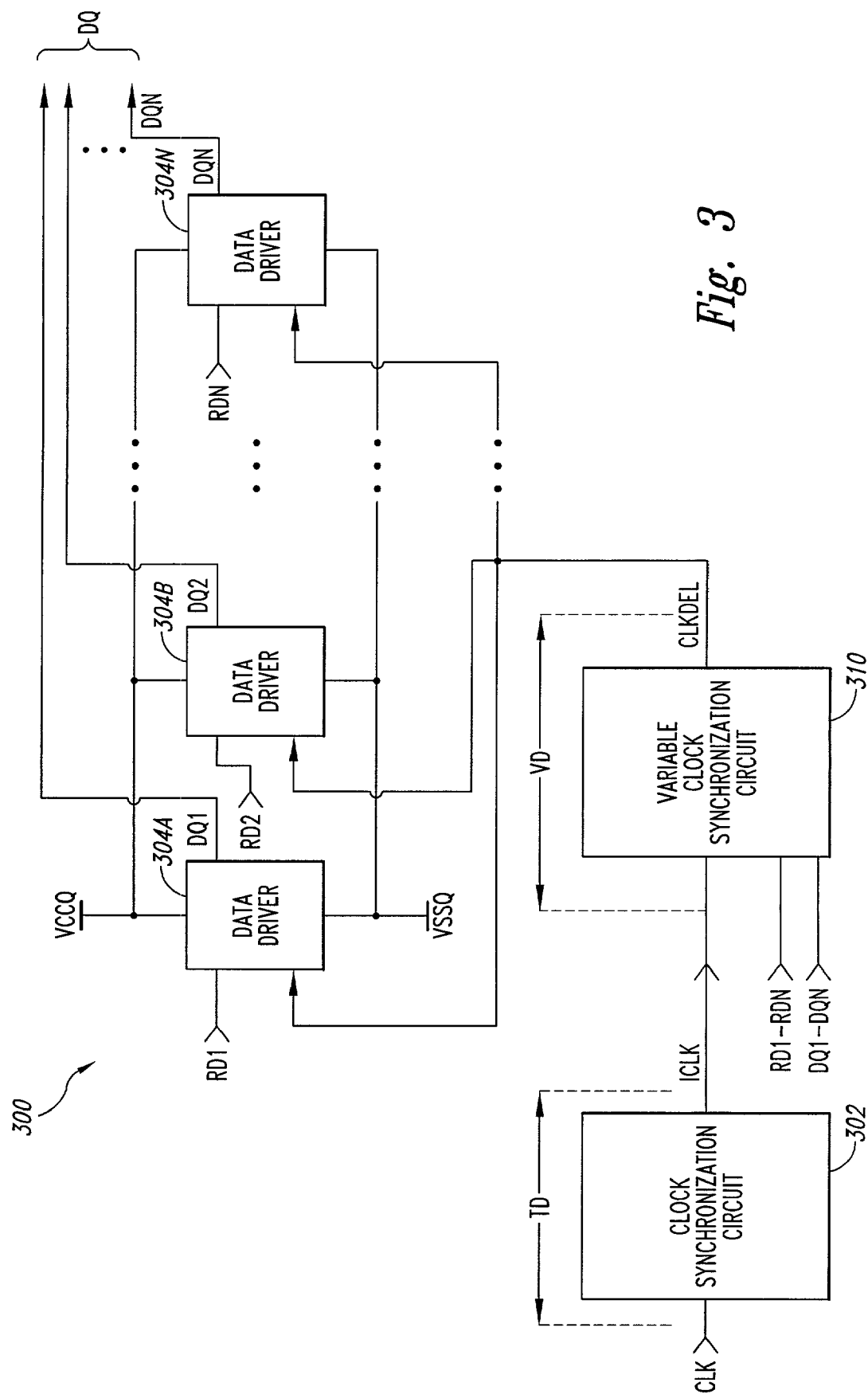
FIG. 3 is a functional block diagram illustrating a data output circuit including a variable clock synchronization circuit for clocking read data onto a wide data bus in synchronism with an external clock signal according to one embodiment of the present invention.

FIG. 3 is a functional block diagram illustrating a data output circuit 300 including a variable clock synchronization circuit 310 that clocks read data signals RD1–RDN onto a wide data bus DQ in synchronism with an applied clock signal CLKDEL independent of the number of data signals DQ1–DQN that are transitioning from a first logic state to a complementary logic state, as will be explained in more detail below. The data output circuit 300 includes a plurality of data drivers 304A–N that operate in the same way as previously described for the data drivers 104A–N of FIG. 1. For the sake of brevity, the operation of the data drivers 304A–N and clock synchronization circuit 302 will not again be described in detail. In the following description, certain details are set forth to provide a sufficient understanding of the present invention. However, it will be clear to one skilled in the art that the present invention may be practiced without these particular details.

In the data output circuit 300, the variable clock synchronization circuit 310 generates a phase shifted clock signal CLKDEL in response to the ICLK signal, with CLKDEL signal having a variable delay VD relative to the ICLK signal. The variable clock synchronization circuit 310 adjusts the value of the variable delay VD in response to the RD1–RDN and DQ1–DQN signals. More specifically, for each RD1–RDN signal and the corresponding DQ1–DQN signal, the variable clock synchronization circuit 310 determines whether the state of the DQ1–DQN signal will change when the corresponding data driver 304A–N is next clocked by the CLKDEL signal. For example, the variable clock synchronization circuit 310 detects the current state of the DQ1 signal and also detects the state of the RD1 signal, which corresponds to the future or upcoming state of the DQ1 signal. In this way, the variable clock synchronization circuit 310 detects the current and upcoming states of the DQ1 signal, and determines whether the state of the DQ1 signal will change when the data driver 304A is clocked by the CLKDEL signal. The variable clock synchronization circuit 310 thereafter adjusts the value of the variable delay VD as a function of these determinations. In this way, the variable clock synchronization circuit 302 adjusts the value of the variable delay VD to clock the data drivers 304A–N at the proper time so that the RD1–RDN signals are placed on the data bus DQ as DQ1–DQN signals in synchronism with the CLK signal through clock synchronous circuit 310.

Figure 4:
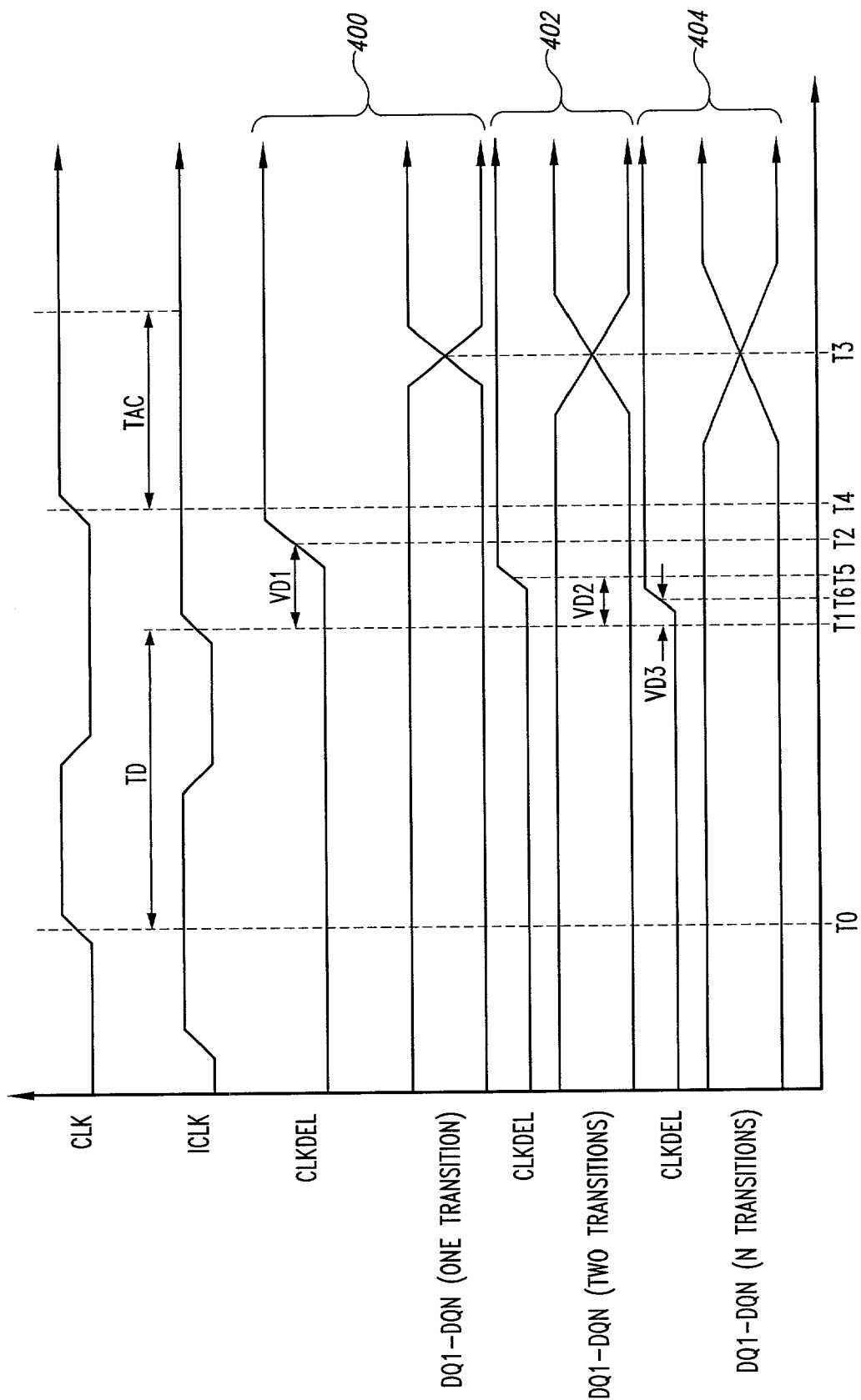
FIG. 4 is a signal timing diagram illustrating the operation of the data output circuit of FIG. 3 in clocking read data onto the wide data bus in synchronism with the external clock signal.

By adjusting the value of the variable delay VD as a function of the DQ1–DQN signals that will be transitioning from a first logic state to a complementary logic state, the variable clock synchronization circuit 310 adjusts the variable delay to compensate for variation in the delay D of the data drivers 304A–N that occurs when a large number of DQ1–DQN signals change logic state, as previously described. FIG. 4 is a signal timing diagram illustrating the operation of the variable clock synchronization circuit 310 in adjusting the value of the variable delay VD to clock the DQ1–DQN signals onto the data bus DQ within the access time TAC specified for the memory device containing the data output circuit 300 and thereby in synchronism with the CLK signal. A first pair of signal diagrams 400 illustrates the CLKDEL and DQ1–DQN signals where only one of the DQ1–DQN signals will transition from a first logic state to a complementary logic state in response to the CLKDEL signal. At a time T0, a first rising-edge of the CLK signal occurs and the ICLK goes high at a time T1. The CLKDEL signal goes high a variable delay VD1 later at a time T2. In response to the CLKDEL signal, the DQ1–DQN signals are output at a time T3 which occurs within the access time TAC of the memory device defined relative to a subsequent rising-edge of the CLK signal at a time T4.

A second pair of signal diagrams 402 illustrates the CLKDEL and DQ1–DQN signals where half of the DQ1–DQN signals will transition from a first logic state to a complementary logic state in response to the CLKDEL signal. In this example, the ICLK signal once again goes high at the time T1 and the CLKDEL signal goes high a variable delay VD2 later at a time T5. In response to the CLKDEL signal going high at the time T5, the DQ1–DQN signals are once again output at the time T3 and within the access time TAC of the memory device. A third pair of signal diagrams 404 illustrates the CLKDEL and DQ1–DQN signals where all of the DQ1–DQN signals will transition from a first logic state to a complementary logic state in response to the CLKDEL signal. In this example, the ICLK signal goes high at the time T1 and the CLKDEL signal goes high a variable delay VD3 later at a time T6. In response to the CLKDEL signal going high at the time T6, the DQ1–DQN signals are once again output at the time T3, which is within the access time TAC of the memory device. In this way, the variable clock synchronization circuit 310 adjusts the variable delay VD of the CLKDEL signal as a function of the number of DQ1–DQN signals that will change logic state to thereby output the DQ1–DQN signals at the same time T3 independent of the number of the signals changing state.

As seen in FIG. 4, the variable clock synchronization circuit 310 reduces the variable delay VD of the CLKDEL signal as the number of DQ1–DQN signals changing logic states increases to compensate for the increasing delay of the data drivers 304A–N. Recall, that the delay of the data drivers 304A–N increases as the number of DQ1–DQN signals changing logic states increases. Thus, as illustrated in FIG. 4, when only one DQ1–DQN signal changes logic state the CLKDEL signal has the variable delay VD1, which is greater than the variable delay VD2 of the CLKDEL signal when two DQ1–DQN signals change logic states. The variable delay VD2 is greater than the variable delay VD3 of the CLKDEL signal when all DQ1–DQN signals change logic states.

As will be appreciated by those skilled in the art, the precise manner in which the variable clock synchronization circuit 310 adjusts the variable delay VD as a function of the number of DQ1–DQN signals changing logic states may vary. For example, the variable clock synchronization circuit 310 may adjust the variable delay VD by reducing the variable delay by a predetermined delay increment for each one of the DQ1–DQN signals changing logic state. In another embodiment, the variable clock synchronization circuit 310 could adjust the variable delay VD by some nonlinear function of the number of DQ1–DQN signals changing logic state. These and other variations of adjusting the variable delay VD as a function of the number of DQ1–DQN signals changing logic states are within the scope of the present invention.

Figure 5:
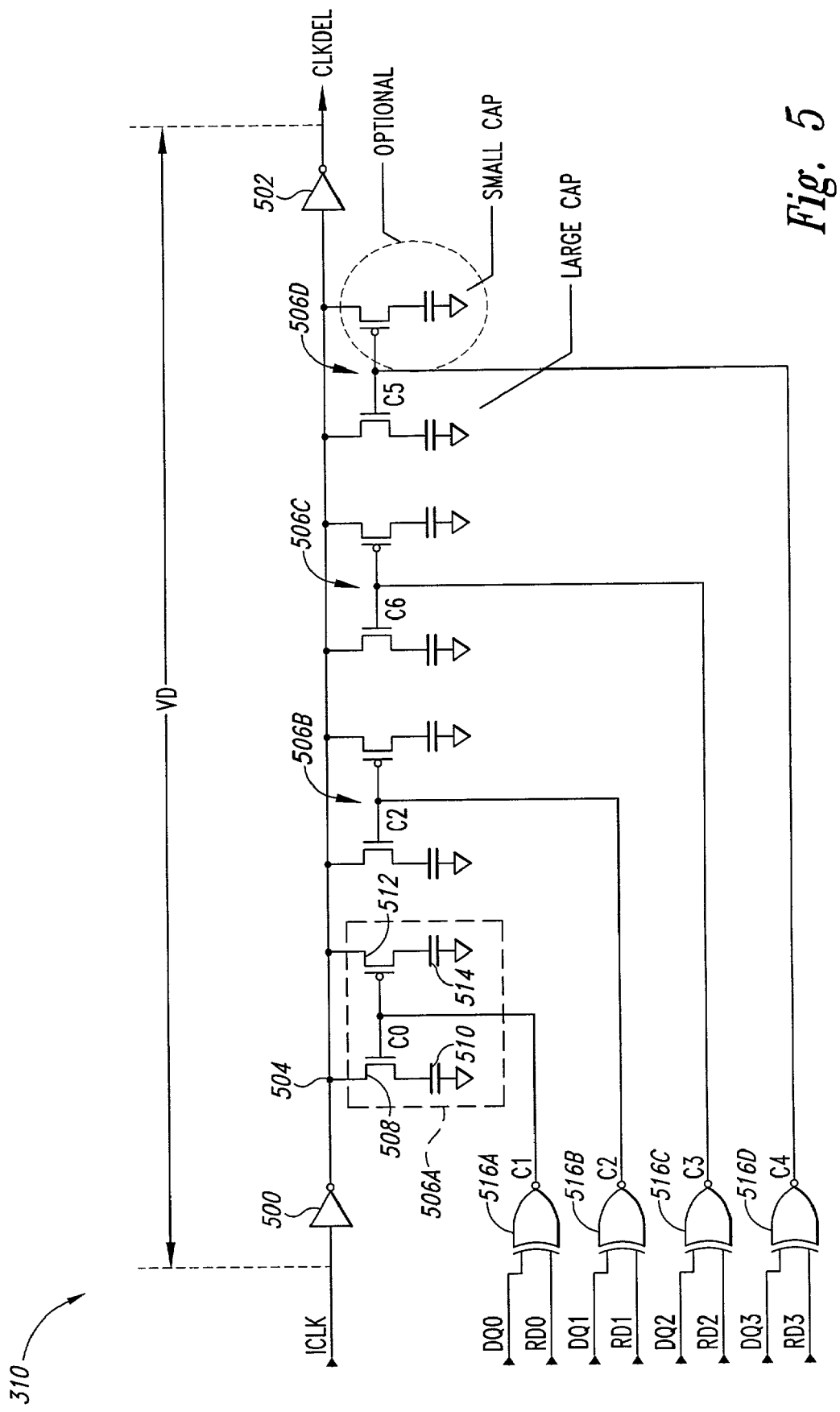
FIG. 5 is a schematic illustrating one embodiment of the variable clock synchronization circuit of FIG. 3.

FIG. 5 is a schematic illustrating one embodiment of the variable clock synchronization circuit 310 of FIG. 3. In the embodiment of FIG. 5, the ICLK signal is applied through first and second series-connected inverters 500, 502 to generate the CLKDEL signal. The variable delay VD of the CLKDEL signal relative to the ICLK signal is controlled by the value of a capacitance on a node 504, which corresponds to the output of the inverter 500. The value of the capacitance on the node 504 is controlled by a plurality of switching circuits 506A–D, each switching circuit including an NMOS transistor 508 and a large capacitor 510 coupled in series between the node 504 and ground, and a PMOS transistor 512 and a small capacitor 514 coupled in series between node 504 and ground. The large capacitor 510 has a capacitance that is greater than the capacitance of the small capacitor 514.

The pairs of transistors 508, 512 in the switching circuits 506A–D receive control signals C1–C4, respectively, from a plurality of the XNOR gates 516A–D which receive pairs of the DQ0–DQ3 and RD0–RD3 signals. Note that in the embodiment of FIG. 5 only four DQ0–DQ3 and RD0–RD3 signals are illustrated merely for ease of explanation, and that the variable clock synchronization circuit 310 would actually contain N switching circuits 506 and N XNOR gates 516, where N corresponds to the width of the data bus DQ. Each XNOR gate 516A–D drives the corresponding control signal C1–C4 signal high when the applied DQ0–DQ3 and RD0–RD3 signals have the same logic state, indicating the logic state of the corresponding DQ0–DQ3 signal is not changing. In contrast, each XNOR gate 516A–D drives the corresponding control signal C1–C4 signal low when the applied DQ0–DQ3 and RD0–RD3 signals have different logic states, indicating the logic state of the corresponding DQ0–DQ3 signal is changing.

When each control signal C1–C4 is high, the corresponding NMOS and PMOS transistors 508 and 512 are turned ON and OFF, respectively, coupling the large capacitor 510 to the node 504. When each control signal C1–C4 is low, the corresponding NMOS and PMOS transistors 508 and 512 are turned OFF and ON, respectively, coupling the small capacitor 514 to the node 504. In this way, each XNOR gate 516A–D functions to couple the small capacitor 514 to the node 504 when the corresponding DQ0–DQ3 signal is changing logic state to thereby decrease the capacitance of the node 504. In contrast, each XNOR gate 516A–D functions to couple the large capacitor 510 to the node 504 when the corresponding DQ0–DQ3 signal is not changing logic state to thereby increase the capacitance of the node 504.

In operation, the XNOR gates 516 generate the control signals C1–C4 to adjust the value of the capacitance on the node 504 as a function of the number of DQ0–DQ3 signals changing logic state. A rising-edge of the ICLK signal is thereafter applied through the inverter 500 which, in turn, drives its output low at a rate determined by the capacitance present on the node 504. Once a voltage on the node 504 reaches a threshold voltage of the inverter 502, the inverter 502 drives the CLKDEL signal high, which occurs the variable delay VD after the rising-edge of the ICLK signal. For each DQ0–DQ3 signal changing logic state, the small capacitor 514 is coupled to the node 504 to thereby reduce the capacitance of the node 504 relative to when the large capacitor 510 is coupled to the node. By decreasing the capacitance of the node 504, the node 504 discharges at a faster rate and thereby reaches the threshold voltage of 502 more quickly which, in turn, drives the CLKDEL signal high more quickly and thus reduces the delay of the CLKDEL. The converse is true when the capacitance of the node 504 is increased by coupling the large capacitor's 510 to the node. Note that when no DQ0–DQ3 signals are changing logic state, the control signals C1–C4 are all high coupling the large capacitor's 510 in the switching circuits 506A–D to the node 504. In this situation, the node 504 has its largest capacitance. In contrast, when all DQ0–DQ3 signals are changing logic state, the control signals C1–C4 are all low, coupling the small capacitor's 514 in the switching circuits 506A–D to the node 504. In this situation, the node 504 has its smallest capacitance value.

Figure 6:
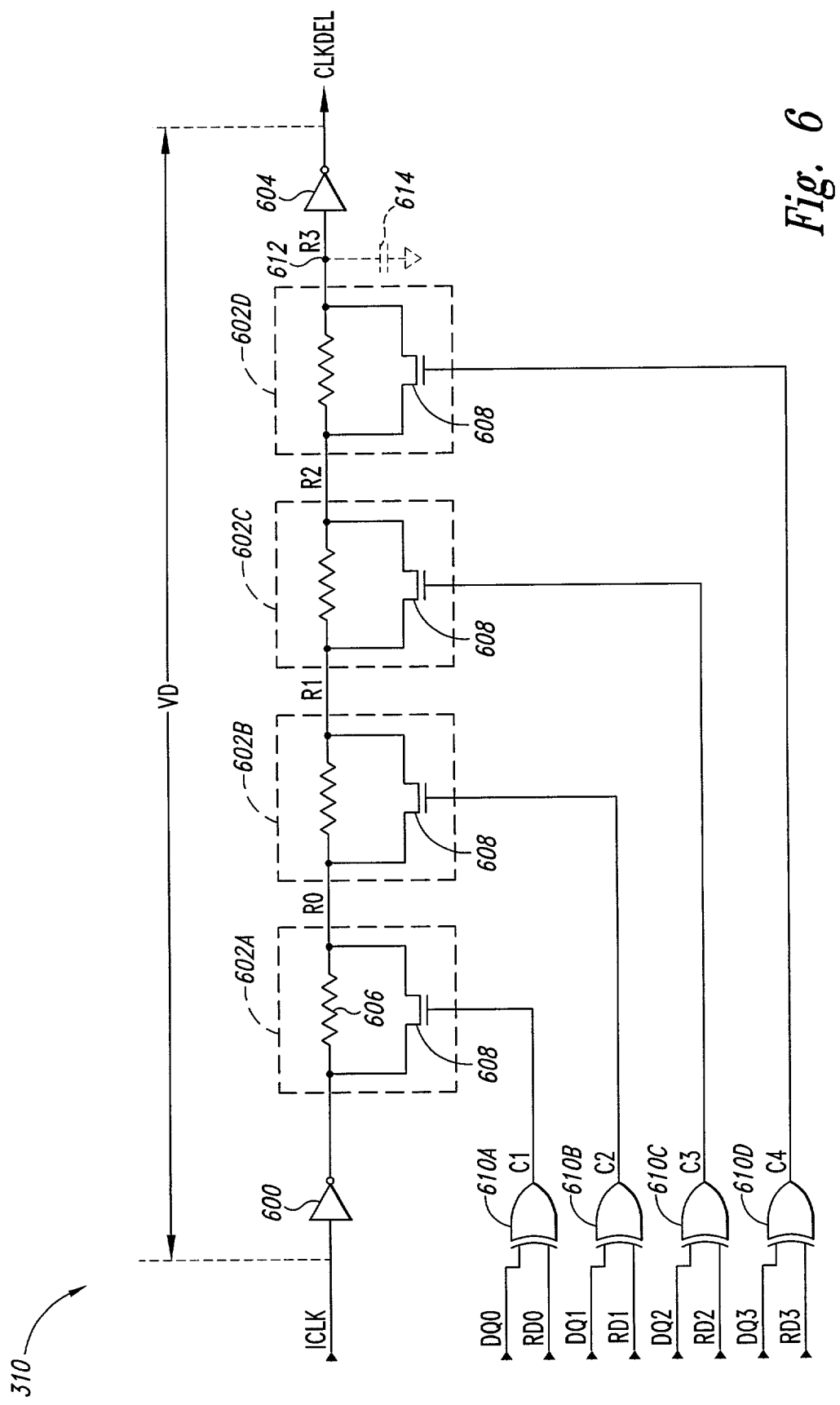
FIG. 6 is a schematic illustrating another embodiment of the variable clock synchronization circuit of FIG. 3.

FIG. 6 is a schematic illustrating another embodiment of the clock synchronization circuit 310 of FIG. 3. In the embodiment of FIG. 6, the ICLK signal is applied through a first inverter 600, through a plurality of series-connected switching circuits 602A–D, and then through a second inverter 604 to generate the CLKDEL signal. Each switching circuit 602A–D includes a parallel-connected resistor 606 and NMOS transistor 608. A plurality of XOR gates 610A–D apply control signals C1–C4 to the NMOS transistor 608 in the switching circuits 602A–D, respectively. Each XOR gate 610A–D receives a pair of the DQ0–DQ3 and RD0–RD3 signals, and drives the corresponding control signal C1–C4 low to turn OFF the corresponding NMOS transistor 608 when the signals have the same logic state, which indicates the logic state of the DQ0–DQ3 signal is not changing. Each XOR gate 610A–D drives the corresponding control signal C1–C4 high to turn ON the corresponding NMOS transistor 602A–D when the signals have different logic states, which indicates the logic state of the DQ0–DQ3 signal is changing.

In operation, each XOR gate 610A–D compares the corresponding DQ0–DQ3 and RD0–RD3 signals, and drives the control signal C1–C4 low to turn OFF the NMOS transistor 608 in the corresponding switching circuits 602A–D when the compared signals have the same logic state. In contrast, when the compared DQ0–DQ3 and RD0–RD3 signals have different logic states, each XOR gate 610A–D drives the control signal C1–C4 high to turn ON the NMOS transistor 608 in the corresponding switching circuit 602A–D. A rising-edge of the ICLK signal is thereafter applied to the inverter 600 which, in turn, drives its output low. The low output from the inverter 600 propagates through either the resistors 606 or the turned ON NMOS transistors 608 in the series-connected switching circuits 602A–D.

In response to the low output from the inverter 600, a node 612, which corresponds to the input of the inverter 604, begins discharging at a rate determined by the number of resistors 606 connected in series between the output of the inverter 600 and the node 612. The node 612 has a capacitance 614 that corresponds to the capacitance presented by the input of the inverter 604, and thus the rate at which a voltage on the node 612 is discharged is determined by the number of series-connected resistors 606 and the value of the capacitance 614, as will be appreciated by those skilled in the art. When the voltage on the node 612 reaches a threshold voltage of the inverter 604, the inverter drives the CLKDEL signal high, which occurs the variable delay VD after rising-edge of the ICLK signal. In this way, in the embodiment of FIG. 6 the XOR gates 610A–D develop the control signals C1–C4 in response to the DQ0–DQ3 and RD0–RD3 signals to selectively turn the NMOS transistors 608 ON or OFF and thereby control the number of resistors 606 connected in series between the output of the inverter 600 and the node 612, which determines the delay of the CLKDEL signal. In the embodiment of FIG. 6, it should be noted that only four DQ0–DQ3 and RD0–RD3 signals are illustrated merely for ease of explanation, and that the variable clock synchronization circuit 310 would actually contain N switching circuits 602 and XOR gates 606, where N corresponds to the width of the data bus DQ.

Figure 7:
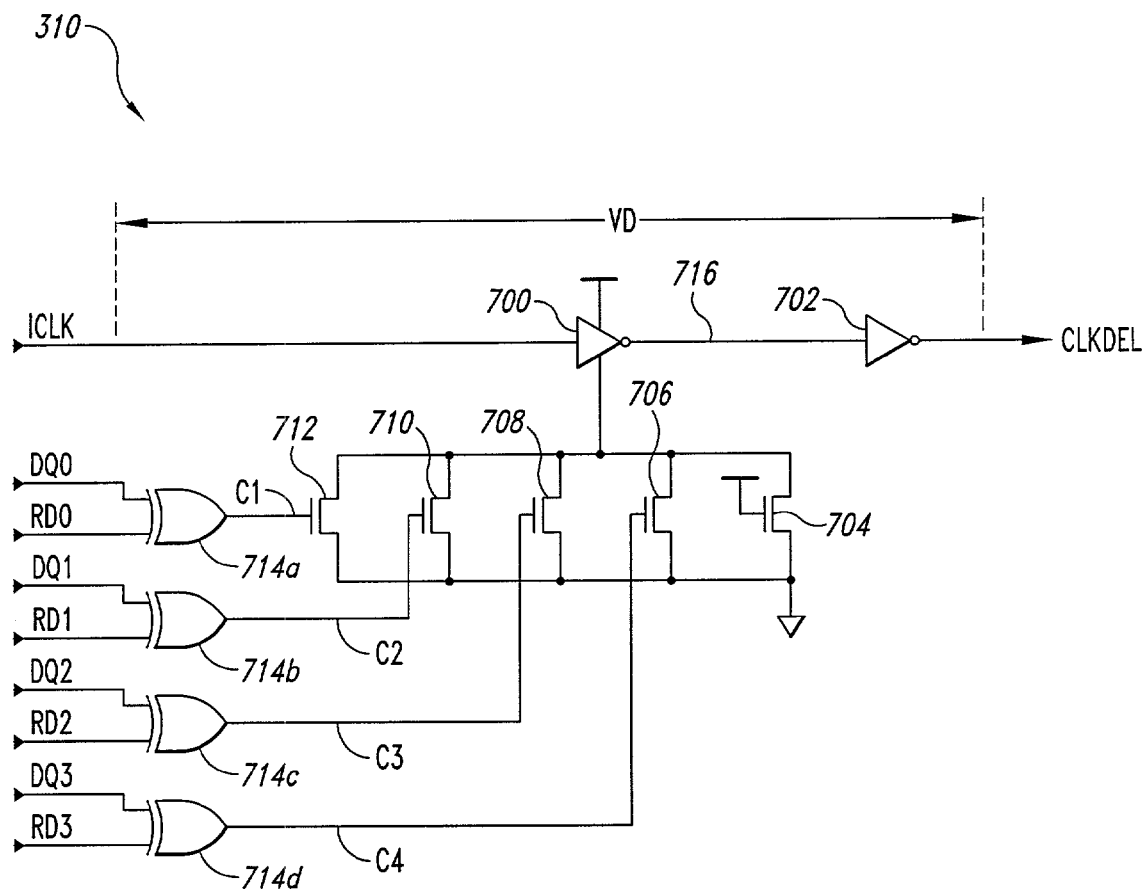
FIG. 7 is a schematic illustrating another embodiment of the variable clock synchronization circuit of FIG. 3.

FIG. 7 is a schematic illustrating another embodiment of the variable clock synchronization circuit 310 of FIG. 3. In the embodiment of FIG. 7, the ICLK signal is applied through a first inverter 700 and a second inverter 702 to generate the CLKDEL signal. The inverter 700 receives a first supply voltage source VCC and a second supply voltage source VSS applied through a plurality of NMOS transistors 704–712. The NMOS transistor 704 has its gate coupled to VCC to bias the transistor and provide the inverter 700 with relatively constant sink current. The NMOS transistors 706–712 are selectively activated in response to control signals C1–C4, respectively, from a group of XOR gates 714A–D that operate as previously described for the XOR gates 610A–D of FIG. 6 in developing the C1–C4 signals in response to the DQ0–DQ3 and RD0–RD3 signals.

In operation, the XOR gates 714A–D develop the C1–C4 signals in response to the DQ0–DQ3 and RD0–RD3 signals to thereby selectively activate the NMOS transistors 706–712. When activated, each NMOS transistor 706–712 provides additional sink current to the inverter 700 to thereby adjust a delay of the inverter which, in turn, adjusts the variable delay VD of the CLKDEL signal. More specifically, the sink current supplied to the inverter 700 determines the rate at which the inverter can drive a node 716 low, where the node 716 corresponds to the input of the inverter 702, as will be appreciated by those skilled in the art. When the inverter 700 discharges the node 716 to a threshold of the inverter 702, the inverter 702 drives the CLKDEL signal high, which occurs the variable delay VD after the corresponding rising-edge of the ICLK signal. In this way, the XOR gates 714A–D selectively activate the NMOS transistors 706–712 responsive to the DQ0–DQ3 and RD0–RD3 signals to adjust the variable delay VD of the CLKDEL signal. Note that when none of the DQ0–DQ3 signals is changing logic state, the XOR gates 714A–D drive the C1–C4 signals low, turning OFF the NMOS transistors 706–712. In this situation, the inverter 700 gets sink current through the NMOS transistor 704 and has a corresponding delay. When any of the DQ0–DQ3 signals is changing logic state, the corresponding XOR gate 714A–D drives the corresponding C1–C4 signal high, turning ON the corresponding NMOS transistor 706–712. The turned ON NMOS transistors 706–712 provide additional sink current to the inverter 700 to thereby adjust the delay of the inverter. In the embodiment of FIG. 7, the circuit 310 adjusts the delay of a rising-edge of the CLKDEL signal as previously described.

As previously described, the variable clock synchronization circuit 310 may be formed from a variety of different circuits, including the embodiment's described with reference to FIGS. 5–7. In addition to the described embodiments, various other circuits for forming the variable clock synchronization circuit 310 will be appreciated by those skilled in the art. For example, the variable clock synchronization circuit 310 may be a DLL or SMD that adjusts the variable delay VD of the CLKDEL signal as a function of the number of DQ1–DQN signals changing logic state.

Figure 8:
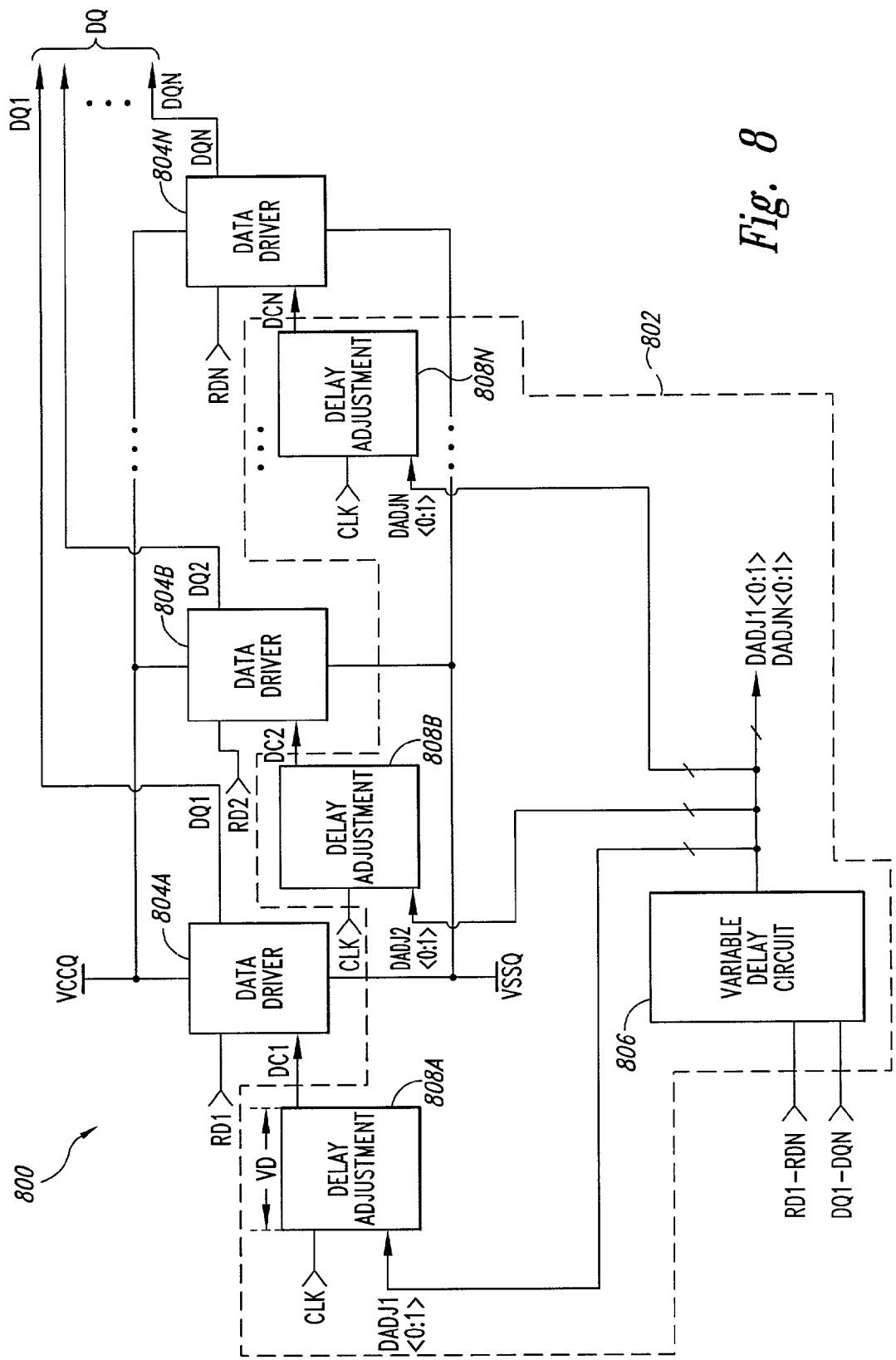
FIG. 8 is a functional block diagram illustrating a data output circuit including a variable clock synchronization circuit for clocking read data signals having respective delays onto a wide data bus according to one embodiment of the present invention.

FIG. 8 is a functional block diagram illustrating a data output circuit 800 including a variable clock a synchronization circuit 802 that clocks respective read data signals RD1–RDN onto a wide data bus DQ in synchronism with an applied clock signal CLK independent of the number of data signals DQ1–DQN transitioning from a first logic state to a complementary logic state, as will be explained in more detail below. The data output circuit 800 includes a plurality of data drivers 804A–N that operate in the same way as previously described for the data drivers 104A–N of FIG. 1, and thus, for the sake of brevity, the operation of these data drivers will not again be described in detail. The variable clock synchronization circuit 802 includes a variable delay circuit 806 that generates a plurality of delay adjustment words DADJ1<0:1>–DADJN<0:1> in response to the RD1–RDN and DQ1–DQN signals. Each DADJ1<0:1>–DADJN<0:1> word is applied to a corresponding delay adjustment circuit 808A–N which, in turn, generates a corresponding delayed clock signal DC1–DCN responsive to the CLK signal. Each DC1–DCN signal has a respective variable delay VD relative to the CLK signal, with the value of the delay VD being determined by the corresponding DADJ1<0:1>–DADJN<0:1> word. The DC1–DCN signals are applied to the data drivers 804A–N, respectively, to clock the RD1–RDN signals out of the data drivers as the DQ1–DQN signals.

In operation, the variable delay circuit 806 develops values for each DADJ1<0:1>–DADJN<0:1> word in response to the applied RD1–RDN and DQ1–DQN signals. In one embodiment, the variable delay circuit 806 develops each DADJ1<0:1>–DADJN<0:1> word as a function of the current and future values of the neighboring RD1–RDN and DQ1–DQN signals. More specifically, in one such embodiment the DQ1–DQN signals are grouped into groups of four. For example, the DQ1–DQ4 signals form a first group, the DQ5–DQ8 signals form a second group, and so on. For each DQ1–DQN signal in a group, the variable delay circuit 806 examines the states of the RD1–RDN and DQ1–DQN signals in the group. First, for a given DQ1–DQN signal in a group, the variable delay circuit 806 determines whether the signal is changing state by examining the corresponding RD1–RDN and DQ1–DQN signals. When the DQ1–DQN signal is not changing state (i.e., the RD1–RDN and DQ1–DQN signals have the same logic state), corresponding DADJ1<0:1>–DADJN<0:1> word is a "don't care" because there will not be a DQ transition for that bit.

For a given signal DQ1–DQN in the group, the variable delay circuit 806 determines the number of other DQ1–DQN signals in the group that are changing to the same logic state. For example, when generating DADJ2<0:1>, DQ2 is a "don't care". RD1–RDN and DQ1–DQN are used to determine how many neighboring DQ's are changing state to the RD2 (next state of DQ2) state. When none of the other DQ1–DQN signals in the group are changing to the same logic state, the variable delay circuit 806 generates the DADJ1–DADJN<0:1> word having the value (0,0). In response to the (0,0) word, the corresponding delay adjustment circuit 808A–N develops the corresponding DC1–DCN signal having a first variable delay VD1 relative to the CLK signal. For example, for the DQ1 signal, when the DQ2–DQ4 signals are not changing to the RD1 logic state, the variable delay circuit applies the DADJ1<0:1> word of (0,0) to the delay adjustment circuit 808A which, in turn, develops the DC1 signal having the delay VD1 relative to the CLK signal.

When one of the other DQ1–DQN signals in the group is changing to the same logic state, the variable delay circuit 806 generates the DADJ1–DADJN<0:1> word having the value (0,1). In response to the (0,1) word, the corresponding delay adjustment circuit 808A–N develops the corresponding DC1–DCN signal having a second variable delay VD2 relative to the CLK signal, with the second variable delay VD2 being less than VD1. Similarly, when two of the other DQ1–DQN signals in the group are changing to the same logic state, the variable delay circuit 806 generates the DADJ1–DADJN<0:1> word having the value (1,0), causing the corresponding delay adjustment circuit 808A–N to develop the DC1–DCN signal having a third variable delay VD3 relative to the CLK signal, with the third variable delay VD3 being less than VD2. Finally, when all three of the other DQ1–DQN signals in the group are changing to the same logic state, the variable delay circuit 806 generates the DADJ1–DADJN<0:1> word having the value (1,1), causing the corresponding delay adjustment circuit 808A–N to develop the DC1–DCN signal having a fourth variable delay VD4 relative to the CLK signal, with the fourth variable delay VD4 being less than VD3.

During operation, the variable delay circuit 806 decreases the delay of each DQ1–DQN signal as more of the other DQ1–DQN signals in the associated group are changing to the same logic state. For example, where the delay of the DQ1 signal is being adjusted, the variable delay circuit 806 sets the DADJ1<0:1> word to (0,0) when none of the DQ2–DQ4 signals are changing to the same state, sets the DADJ1<0:1> word to (0,1) when one of the DQ2–DQ4 signals is changing to the same state, sets the DADJ1<0:1> word to (1,0) when two of the DQ2–DQ4 signals are changing to the same state, and sets the DADJ1<0:1> word to (1,1) when all three of the DQ2–DQ4 signals are changing to the same state. In this way, the delay of the DQ1 signal is decreased from VD1 to VD4 as more of the DQ2–DQ4 signals are changing to the same logic state. For example, if the DQ1 signal is transitioning from high to low and each of the DQ2–DQ4 signals is transitioning from low to high, the variable delay circuit 806 will set the DADJ1<0:1> word to (0,0) and set each of the DADJ2–4<0:1> words to (1,0). As a result, the DC1 signal is applied to the data drier 804A at a first time while the DC2–DC4 signals are applied to the data drivers 804B–804D, respectively, at a second time.

Furthermore, note that the variable delay circuit 806 may also be viewed as increasing the delay of the DQ1 signal when the delay may be too small. For example, assume the DADJ1<0:1> word is initially equal to (0,1), which occurs when one of the DQ2–DQ4 signals is changing to the same state. Now assume the variable delay circuit 806 thereafter detects for the upcoming DQ1 signal that none of the DQ2–DQ4 signals is changing to the same state. In this situation, the variable delay circuit 806 changes the DADJ1<0:1> word from (0,1) to (0,0) to thereby increase the delay of the DQ1 signal from VD2 to VD1. This is true because, as previously described, as more neighboring signals change to the same state the delay of the DQ1 signal increases so the variable delay VD must be decreased to compensate for the increasing delay of the DQ1 signal. In contrast, the delay of the DQ1 signal will decrease when fewer of the neighboring signals DQ2–DQ4 change to the same state, and thus the variable delay VD must be increased to compensate for the decreasing delay of the DQ1 signal.

The variable clock synchronization circuit 802 formed by the variable delay circuit 806 and delay adjustment circuits 808A–N adjusts the respective delays at which the DQ1–DQN signals are clocked onto the data bus DQ relative to the CLK signal. In this way, the variable delay VD of each DQ1–DQN signal is independently adjusted, instead of adjusting the single delayed clock signal CLKDEL as in the clock synchronization circuit 310 of FIG. 3. This allows the delay of each DQ1–DQN signal to be adjusted to ensure the access time TAC specified for the memory device containing the circuit 802 is satisfied by independently adjusting a "data eye" for each DQ1–DQN signal to allow the signals to be latched in response to the CLK signal, as will be appreciated by those skilled in the art. One skilled in the art will appreciate that various other processes may be performed by the variable clock synchronization circuit 802 in developing the DADJ1<0:1>–DADJN<0:1> words, and that each word may include more bits to provide smaller increments for adjusting value of the variable delay VD of the each DQ1–DQN signal. As is known in the art, the use of a PLL or DLL or similar circuit allows for the DC1–DCN clock signals to occur before the CLK signal if it is desirable for some or all combinations of RDX/DQX signals to have a phase shifted clock signal which is advanced in time.

Figure 9:
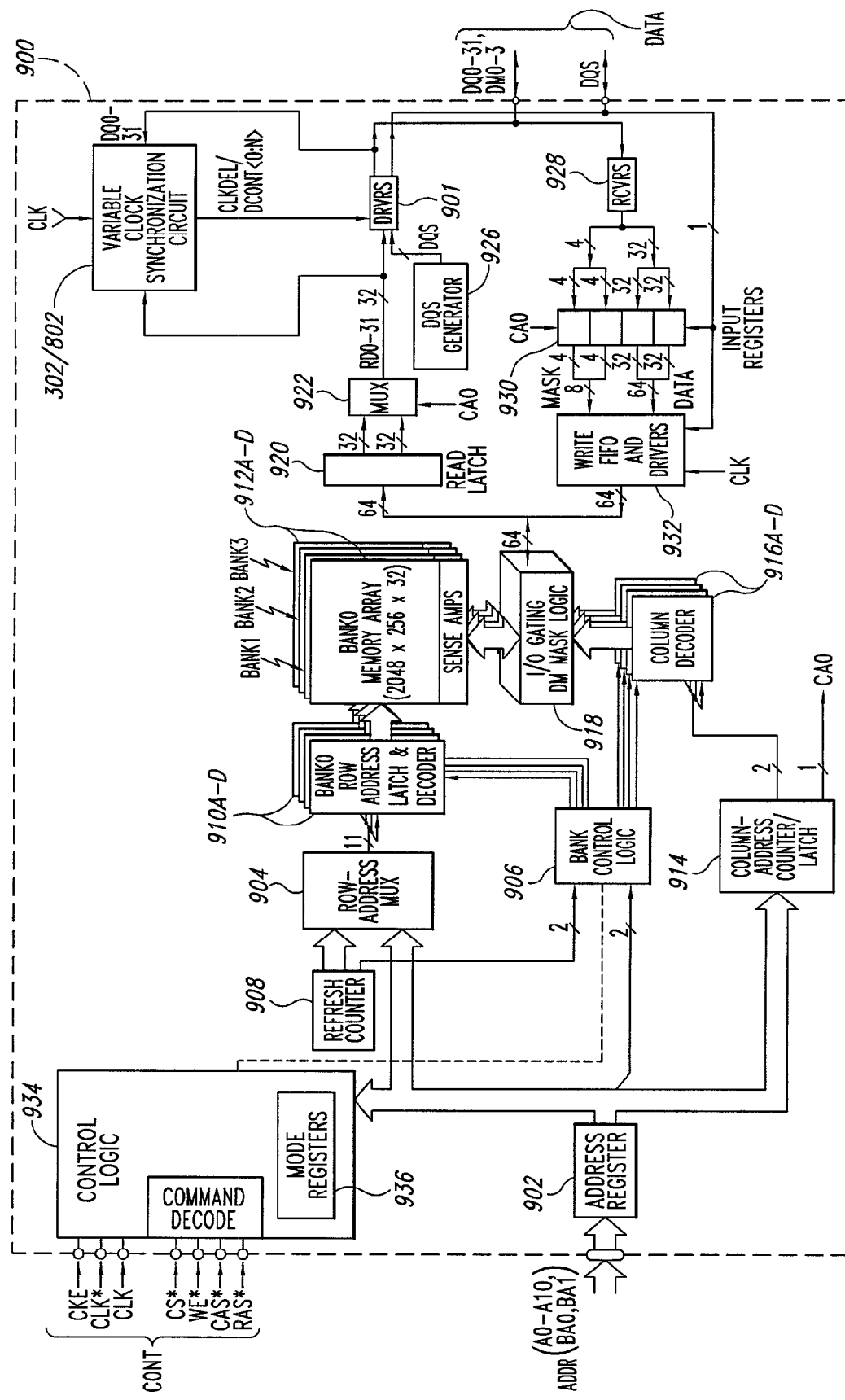
FIG. 9 is a functional block diagram of a synchronous memory device including the variable clock synchronization circuit of FIG. 3 and/or FIG. 8.

FIG. 9 is a functional block diagram of a memory device 900 including the variable clock synchronization circuit 310 of FIG. 3 and/or the variable clock synchronization circuit 802 of FIG. 8 that apply the CLKDEL/DC1–DCN signals to clock read data drivers 901, which correspond to the data drivers 304 and 804 in FIGS. 3 and 8, respectively, as will now be explained in more detail. The data drivers 901 output data signals DQ0–DQ31 and a data strobe signal DQS on a data bus DATA in synchronism with an applied external clock signal CLK in response to the CLKDEL/DC1–DCN signals from the variable clock synchronization circuit 310/802, which operates as previously described to adjust the delay of the CLKDEL/DC1–DCN signals relative to the CLK signal as a function of the DQ0–31 signals and a plurality of read data signals RD0–31. In the following description, the DQ0–31 signals will collectively be referred to as the data word DQ0–31 and the RD0–31 signals will collectively be referred to as the read data word RD0–31. The memory device 900 in FIG. 9 is a double-data rate (DDR) synchronous dynamic random access memory ("SDRAM"), although as previously mentioned the principles described herein are applicable to any memory device that may include a delay controller or other clock synchronization circuit for synchronizing internal and external signals, such as conventional synchronous DRAMs (SDRAMs), as well as packetized memory devices like SLDRAMs and RDRAMs, and are equally applicable to any integrated circuit that must synchronize internal and external clocking signals.

The memory device 900 includes an address register 902 that receives row, column, and bank addresses over an address bus ADDR, with a memory controller (not shown) typically supplying the addresses. The address register 902 receives a row address and a bank address that are applied to a row address multiplexer 904 and bank control logic circuit 906, respectively. The row address multiplexer 904 applies either the row address received from the address register 902 or a refresh row address from a refresh counter 908 to a plurality of row address latch and decoders 910A–D. The bank control logic 906 activates the row address latch and decoder 910A–D corresponding to either the bank address received from the address register 902 or a refresh bank address from the refresh counter 908, and the activated row address latch and decoder latches and decodes the received row address. In response to the decoded row address, the activated row address latch and decoder 910A–D applies various signals to a corresponding memory bank 912A–D to thereby activate a row of memory cells corresponding to the decoded row address. Each memory bank 912A–D includes a memory-cell array having a plurality of memory cells arranged in rows and columns, and the data stored in the memory cells in the activated row is stored in sense amplifiers in the corresponding memory bank. The row address multiplexer 904 applies the refresh row address from the refresh counter 908 to the decoders 910A–D and the bank control logic circuit 906 uses the refresh bank address from the refresh counter when the memory device 900 operates in an auto-refresh or self-refresh mode of operation in response to an auto- or self-refresh command being applied to the memory device 900, as will be appreciated by those skilled in the art.

A column address is applied on the ADDR bus after the row and bank addresses, and the address register 902 applies the column address to a column address counter and latch 914 which, in turn, latches the column address and applies the latched column address to a plurality of column decoders 916A–D. The bank control logic 906 activates the column decoder 916A–D corresponding to the received bank address, and the activated column decoder decodes the applied column address. Depending on the operating mode of the memory device 900, the column address counter and latch 914 either directly applies the latched column address to the decoders 916A–D, or applies a sequence of column addresses to the decoders starting at the column address provided by the address register 902. In response to the column address from the counter and latch 914, the activated column decoder 916A–D applies decode and control signals to an I/O gating and data masking circuit 918 which, in turn, accesses memory cells corresponding to the decoded column address in the activated row of memory cells in the memory bank 912A–D being accessed.

During data read operations, data being read from the addressed memory cells is coupled through the I/O gating and data masking circuit 918 to a read latch 920. The I/O gating and data masking circuit 918 supplies 2N bits of data to the read latch 920, which then applies two N-bit words to a multiplexer 922. In the embodiment of FIG. 3, the circuit 918 provides 64 bits (N=32) to the read latch 920 which, in turn, provides two 32 bit read data words RD0–31 to the multiplexer 922. The data drivers 901 sequentially receive the RD0–31 words from the multiplexer 922, and also receives a data strobe signal DQS from a strobe signal generator 926 and the CLKDEL/DC1–DCN signals from the variable clock synchronization circuit 310/802. The DQS signal is used by an external circuit such as a memory controller (not shown) in latching data from the memory device 900 during read operations. In response to the CLKDEL/DC1–DCN signals, the data drivers 901 sequentially output each received RD0–31 word as a corresponding data word DQ0–31, each DQ0–31 word being output in synchronism with a rising or falling edge of the CLK signal that is applied to clock the memory device 900. The data drivers 901 also output the data strobe signal DQS having rising and falling edges in synchronism with rising and falling edges of the CLK signal, respectively. Each data word DQ0–31 and the data strobe signal DQS collectively define the data bus DATA. The DATA bus also includes masking signals DM0–M, which will be described in more detail below with reference to data write operations.

As will be appreciated by those skilled in the art, the CLKDEL/DC1–DCN signals from the variable clock synchronization circuit 310/802 are phase shifted relative to the CLK signal, and the variable clock synchronization circuit adjusts the phase shift of the CLKDEL/DC1–DCN signals relative to the CLK signal as a function of the DQ0–31 and RD0–31 words to ensure that the DQS signal and the DQ words are placed on the DATA bus in synchronism with the CLK signal regardless of the number of bits changing state between the current DQ0–31 word being output on the DATA bus and the RD0–31 word, which corresponds to the next DQ0–31 word to be output on the DATA bus, as previously described. During data write operations, an external circuit such as a memory controller (not shown) applies N bit (N=32 in the example of FIG. 8) data words DQ0–N, the strobe signal DQS, and X (X=4 in the example of FIG. 8) data masking signals DM0–3 on the data bus DATA. A data receiver 928 receives each DQ0–N word and the associated DM0–3 signals, and applies these signals to input registers 930 that are clocked by the DQS signal. In response to a rising edge of the DQS signal, the input registers 930 latch a first DQ0–N word and the associated DM0–3 signals, and in response to a falling edge of the DQS signal the input registers latch a second DQ0–N word and associated DM0–3 signals. The input register 930 provides the two latched DQ0–N words as a 64-bit data word to a write FIFO and driver 932, and applies the two latched DM0–3 words as an 8-bit masking word to the FIFO and driver. The FIFO and driver 932 latches the applied 64-bit data word and 8-bit masking word in response to the DQS signal. The 64-bit data word is clocked out of the write FIFO and driver 932 in response to the CLK signal, and is applied to the I/O gating and masking circuit 918. The I/O gating and masking circuit 918 transfers the 64-bit data word to the addressed memory cells in the accessed bank 912A–D subject to the 8-bit masking word, which may be used to selectively mask bits or groups of bits in the data word (i.e., in the write data) being written to the addressed memory cells.

A control logic and command decoder 934 receives a plurality of command and clocking signals over a control bus CONT, typically from an external circuit such as a memory controller (not shown). The command signals include a chip select signal CS*, a write enable signal WE*, a column address strobe signal CAS*, and a row address strobe signal RAS*, while the clocking signals include a clock enable signal CKE* and complementary clock signals CLK, CLK*, with the "*" designating a signal as being active low. The command signals CS*, WE*, CAS*, and RAS* are driven to values corresponding to a particular command, such as a read, write, or load mode register command. In response to the clock signals CLK, CLK*, the command decoder 934 latches and decodes an applied command, and generates a sequence of clocking and control signals that control the components 902–932 to execute the function of the applied command. The clock enable signal CKE enables clocking of the command decoder 934 by the clock signals CLK, CLK*. The command decoder 934 latches command and address signals at positive edges of the CLK, CLK* signals (i.e., the crossing point of CLK going high and CLK* going low), while the input registers 930 and data drivers 901 transfer data into and from, respectively, the memory device 900 in response to both edges of the data strobe signal DQS and thus at double the frequency of the clock signals CLK, CLK*. This is true because the DQS signal has the same frequency as the CLK, CLK* signals. The memory device 900 is referred to as a double-data-rate device because the data words DQ being transferred to and from the device are transferred at double the rate of a conventional SDRAM, which transfers data at a rate corresponding to the frequency of the applied clock signal. The control logic and command decoder 934 also includes a mode register 936 that is used to define a specific parameters that define a mode of operation of the memory device 900. This definition includes selection of a burst length, burst type, CAS latency, and an operating mode of the device 900. An external circuit, such as a memory controller or memory tester, applies the command signals CS*, WE*, CAS*, and RAS* corresponding to a load mode register command to load appropriate bits into the mode register 936 to thereby set the various parameters and define the mode of operation of the device 900. The detailed operation of the control logic and command decoder 934 in generating the control and timing signals and the mode register 936 in defining the mode of operation of the memory device 900 are conventional, and thus, for the sake of brevity, will not be described in more detail.

Figure 10:
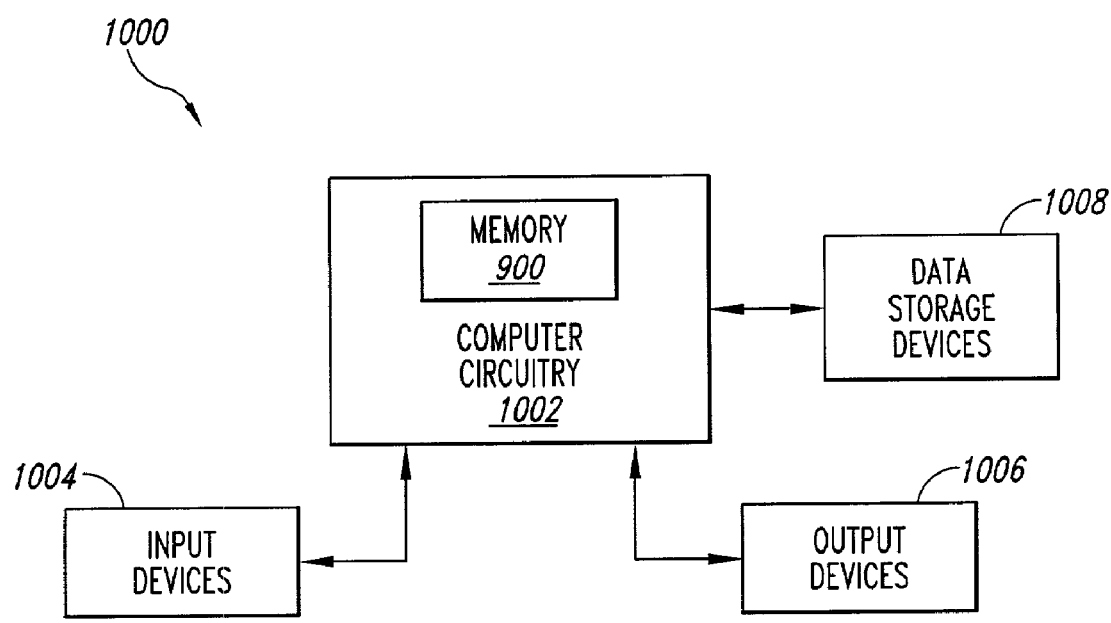
FIG. 10 is a functional block diagram of a computer system including the synchronous memory device of FIG. 9.

FIG. 10 is a block diagram of a computer system 1000 including computer circuitry 1002 that includes the memory device 900 of FIG. 9. Typically, the computer circuitry 1002 is coupled through address, data, and control buses to the memory device 900 to provide for writing data to and reading data from the memory device. The computer circuitry 1002 includes circuitry for performing various computing functions, such as executing specific software to perform specific calculations or tasks. In addition, the computer system 1000 includes one or more input devices 1004, such as a keyboard or a mouse, coupled to the computer circuitry 1002 to allow an operator to interface with the computer system. Typically, the computer system 1000 also includes one or more output devices 1006 coupled to the computer circuitry 1002, such as output devices typically including a printer and a video terminal. One or more data storage devices 1008 are also typically coupled to the computer circuitry 1002 to store data or retrieve data from external storage media (not shown). Examples of typical storage devices 1008 include hard and floppy disks, tape cassettes, compact disk read-only (CD-ROMs) and compact disk read-write (CD-RW) memories, and digital video disks (DVDs).

It is to be understood that even though various embodiments and advantages of the present invention have been set forth in the foregoing description, the above disclosure is illustrative only, and changes may be made in detail, and yet remain within the broad principles of the invention. For example, some of the components described above may be implemented using either digital or analog circuitry, or a combination of both, and also, where appropriate, may be realized through software executing on suitable processing circuitry. Therefore, the present invention is to be limited only by the appended claims.

The invention claimed is:

1. A clock synchronization circuit adapted to receive an input clock signal and adapted to receive current data signals and respective future data signals, the clock synchronization circuit comprising:
   a logic circuit coupled to receive the future data and current data signals, and operable to develop a plurality of phase shift control signals in response to the future data and current data signals; and
   a phase shift circuit adapted to receive the input clock signal and coupled to the logic circuit to receive the plurality of phase shift control signals, and operable to generate a phase shifted clock signal having a phase shift relative to the input clock signal that is a function of the current and respective future data signals, the phase shifted clock signal having a delay determined by the plurality of phase shift control signals.

2. The clock synchronization circuit of claim 1 wherein the clock synchronization circuit is operable to add a first phase shift increment to the phase shifted clock signal for each pair of current and respective future data signals having the same logic state, and is operable to add a second phase shift increment to the phase shifted clock signal for each pair of current and respective future data signals having complementary logic states.

3. The clock synchronization circuit of claim 2 wherein the first phase shift increment is greater than the second phase shift increment.

4. The clock synchronization circuit of claim 1 wherein the phase shift of the phase shifted clock signal comprises a phase shift having a value that is a function of the logic states of the current and future data signals.

5. The clock synchronization circuit of claim 1 wherein the logic circuit comprises a plurality of XNOR gates, each XNOR gate receiving a current data signal and its respective future data signal and developing a corresponding one of the plurality of phase shift control signals responsive to the future data and current data signals.

6. The clock synchronization circuit of claim 1 wherein the phase shift circuit comprises:
   a plurality of switching circuits coupled to an output node, each switching circuit coupled to the logic circuit to receive a respective one of the plurality of phase shift control signals and operable responsive to the respective one of the plurality of phase shift control signal having a first state to couple a first phase shift element to the output node and operable responsive to the respective one of the phase shift control signal having a second state to couple a second phase shift element to the output node;

an input circuit having an input adapted to receive the input clock signal and having an output coupled to the output node, and being operable to develop a charging signal on the output node responsive to the input clock signal, the charging signal having a delay in reaching a threshold value that is determined by the first and second phase shift elements coupled to the output node; and an output circuit coupled to the output node and operable to develop the phase shifted clock signal responsive to the charging signal reaching the threshold value.

7. The clock synchronization circuit of claim 6 wherein the input and output circuits each comprise an inverter.

8. The clock synchronization circuit of claim 6 wherein each first phase shift element comprises a first capacitor having a first capacitance and each second phase shift element comprises a second capacitor having a second capacitance, the first capacitance being greater than the second capacitance.

9. The clock synchronization circuit of claim 8 wherein each of the plurality of switching circuits comprises a first transistor coupled in series with the corresponding first capacitor between the output node and a reference voltage source, and further comprises a second transistor coupled in series with the corresponding second capacitor between the output node and the reference voltage source, the first and second transistors of each of the plurality of switching circuits each having a control terminal coupled to receive the phase shift control signal of its particular switching circuit.

10. The clock synchronization circuit of claim 9 wherein the first transistor comprises an NMOS transistor and the second transistor comprises a PMOS transistor.

11. The clock synchronization circuit of claim 1 wherein the phase shift circuit comprises:

an input circuit adapted to receive the input clock signal and being operable to develop an output signal on an output responsive to the input clock signal;

an output circuit having an input coupled to a charging node and being operable to develop the phase shifted clock signal responsive to a charging signal on the charging node reaching a threshold value; and a plurality of switching circuits coupled in series between the output of the input circuit and the charging node; each switching circuit coupled to the logic circuit to receive a respective one of the phase shift control signals and operable responsive to its respective phase shift control signal having a first state to provide a first phase shift element and operable responsive to its respective phase shift control signal having a second state to provide a second phase shift element, the combination of first and second phase shift elements coupled in series controlling a rate at which the charging signal reaches the threshold value.

12. The clock synchronization circuit of claim 11 wherein the input and output circuits each comprise an inverter.

13. The clock synchronization circuit of claim 11 wherein each first phase shift element comprises a resistor and each second phase shift element comprises a transistor having signal terminals coupled in paralled with its corresponding resistor and having a control terminal coupled receive its corresponding phase shift control signal.

14. The clock synchronization circuit of claim 13 wherein each transistor comprises a NMOS transistor.

15. The clock synchronization circuit of claim 1 wherein the phase shift circuit comprises:

an input circuit adapter to receive the input clock signal and including a supply node, the input circuit operable to develop the phase shifted clock signal responsive to the input clock signal, the phase shift of the phase shifted clock signal being a function of a supply current provided to the supply node; and a plurality of switching circuits coupled in parallel between a supply voltage source and the supply node, each switching circuit coupled to the logic circuit to receive a respective one of the phase shift control signals and operable responsive to its respective phase shift control signal having a first state to provide a first current to the supply node and operable responsive to its respective phase shift control signal having a second state to provide a second current to the supply node, the combination of first and second currents from the plurality of switching circuits controlling the supply current provided to the supply node.

16. The clock synchronization circuit of claim 15 wherein each switching circuit comprises a transistor having signal terminals coupled between the supply voltage source and the supply node, and having a control terminal coupled to receive its corresponding phase shift control signal.

17. The clock synchronization circuit of claim 16 wherein each transistor comprises a PMOS transistor.

18. The clock synchronization circuit of claim 15 wherein the input circuit comprises a first inverter coupled to receive the input clock signal and including the supply node, and a second inverter coupled in series with the first inverter and operable to develop the phase shifted clock signal responsive to an output signal from first inverter.

19. The clock synchronization circuit of claim 1 wherein the phase shift of the phase shifted clock signal comprises a delay relative to the input clock signal.

20. A data output circuit, comprising:

a plurality of data drivers, each data driver adapter to receive a respective read data signal and being operable to store the respective read data signal in response to a phase shifted clock signal and output the stored respective read data signal as a corresponding output data signal; and a clock synchronization circuit adapter to receive an input clock signal and adapted to receive the plurality of respective read and corresponding output data signals, and coupled to the plurality of data drivers, the clock synchronization circuit operable to generate the phase shifted clock signal in response to the input clock signal and apply the phase shifted clock signal to clock the plurality of respective read data signals out of the plurality of data drivers as the corresponding plurality of output data signals, the clock synchronization circuit operable to add a first phase shift increment to the phase shift of the phase shifted clock signal for each of the plurality of read data signals and corresponding output data signals having the same logic state, and operable to alternatively add a second phase shift increment to the phase shift of the phase shifted clock signal for each of the plurality of read data signals and corresponding output data signals having complementary logic states.

21. The data output circuit of claim 20 wherein the first phase shift increment is greater than the second phase shift increment.

22. The data output circuit of claim 20 wherein the phase shift of the phase shifted clock signal comprises a phase shift having a value that is a function of the logic states of the plurality of respective read data and corresponding output data signals.

23. A data output circuit, comprising:
a plurality of data drivers, each data driver adapted to receive a respective read data signal and being operable to store the respective read data signal as a corresponding output data signal;
a logic circuit coupled to receive the plurality of respective read data and corresponding output data signals, and operable to develop a plurality of phase shift control signals in response to the plurality of respective read data and corresponding output data signals;
a plurality of switching circuits coupled to an output node, each switching circuit coupled to the logic circuit to receive a respective one of the phase shift control signals and operable responsive to the respective one of the phase shift control signal having a first state to couple a respective first delay element to the output node and operable responsive to the respective one of the phase shift control signals having a second state to couple a respective second delay element to the output node;
an input circuit having an input adapted to receive an input clock signal and having an output coupled to the output node, and being operable to develop a charging signal on the output node responsive to the input clock signal, the charging signal having a delay in reaching a threshold value that is determined by the first and second delay elements coupled to the output node; and
an output circuit coupled to the output node and operable to develop the phase shift clock signal responsive to the charging signal reaching the threshold value.

24. The data output circuit of claim 23 wherein the logic circuit comprises a plurality of XNOR gates, each XNOR gate receiving one of the plurality of respective read data and corresponding output data signals and developing a corresponding one of the plurality of phase shift control signals responsive to the one of the plurality of respective read data and corresponding output data signals.

25. The data output circuit of claim 23 wherein the input and output circuits each comprise an inverter.

26. The data output circuit of claim 23 wherein each first delay element comprises a first capacitor having a first capacitance and each second delay element comprises a second capacitor having a second capacitance, the first capacitance being greater than the second capacitance.

27. The data output circuit of claim 26 wherein each of the plurality of switching circuits comprises a first transistor coupled in series with the respective first capacitor between the output node and a reference voltage source, and further comprises a second transistor coupled in series with the respective second capacitor between the output node and the reference voltage source, the first and second transistors of each of the plurality of switching circuits each having a control terminal coupled to receive the phase shift control signal of its particular switching circuit.

28. The data output circuit of claim 27 wherein the first transistor comprises an NMOS transistor and the second transistor comprises a PMOS transistor.

29. A data output circuit comprising:
a plurality of data drivers, each data driver adapter to receive a respective read data signal and being operable to store the respective read data signal as a corresponding output data signal;
a logic circuit coupled to receive the plurality of respective read data and corresponding output data signals, and operable to develop a plurality of phase shift control signals in response to the plurality of respective read data and corresponding output data signals;
an input circuit adapted to receive an input clock signal and being operable to develop an output signal on an output responsive to the input clock signal;
an output circuit having an input coupled to a charging node and being operable to develop the phase shifted clock signal responsive to a charging signal on the charging node reaching a threshold value; and
a plurality of switching circuits coupled in series between the output of the input circuit and the charging node; each switching circuit coupled to the logic circuit to receive a respective one of the phase shift control signals and operable responsive to its respective phase shift control signal having a first state to provide a first delay element and operable responsive to its respective phase shift control signal having a second state to provide a second delay element, the combination of first and second delay elements coupled in series controlling a rate at which the charging signal reaches the threshold value.

30. The data output circuit of 29 wherein the input and output circuits each comprise an inverter.

31. The data output circuit of claim 29 wherein each first delay element comprises a resistor and each second delay element comprises a transistor having signal terminals coupled in parallel with its corresponding resistor and having a control terminal coupled to receive its corresponding phase shift control signal.

32. The data output circuit of claim 31 wherein each transistor comprises a NMOS transistor.

33. A data output circuit comprising:
a plurality of data drivers, each data driver adapted to receive a respective read data signal and being operable to store the respective read data signal in response to a phase shifted clock signal and output the stored respective read data signal as a corresponding output data signal;
a logic circuit coupled to receive the plurality of respective read data and corresponding output data signals, and operable to develop a plurality of phase shift control signals in response to the plurality of respective read data and corresponding output data signals;
an input circuit adapted to receive an input clock signal and including a supply node, the input circuit operable to develop the phase shifted clock signal responsive to the input clock signal, the phase shift of the phase shifted clock signal being a function of a supply current provided to the supply node; and
a plurality of switching circuits coupled in parallel between a ground voltage source and the supply node, each switching circuit coupled to the logic circuit to receive a respective one of the phase shift control signals and operable responsive to its respective phase shift control signal having a first state to provide a first current to the supply node and operable responsive to its respective phase shift control signal having a second state to provide a second current to the supply node, the combination of first and second currents from the plurality of switching circuits controlling the sink current provided to the supply node.

34. The data output circuit of claim 33 wherein each switching circuit comprises a transistor having signal terminals coupled between the ground voltage source and the supply node, and having a control terminal coupled to receive its corresponding phase shift control signal, and an additional switching circuit comprises a transistor having signal terminals coupled between the ground voltage source and the supply node and having a control terminal adapted to receive a bias voltage.

35. The data output circuit of claim 34 wherein each transistor comprises a NMOS transistor.

36. The data output circuit of claim 33 wherein the input circuit comprises a first inverter coupled to receive the input clock signal and including the supply node, and a second inverter coupled in series with the first inverter and operable to develop the delayed clock signal responsive to an output signal from first inverter.

37. A memory device, comprising:
an address bus;
a control bus;
a data bus;
an address decoder coupled to the address bus;
a read/write circuit coupled to the data bus;
a control circuit coupled to the control bus;
a memory-cell array coupled to the address decoder, control circuit, and read/write circuit; and
a clock synchronization circuit adapted to receive an input clock and coupled to the read/write circuit to receive current data signals and respective future data signals, the clock synchronization circuit comprising:
a logic circuit coupled to receive the future data and current data signals, and operable to develop a plurality of phase shift control signals in response to the future data and current data signals; and
a phase shift circuit adapted to receive the input clock signal and coupled to the logic circuit to receive the plurality of phase shift control signals, and operable to generate a phase shifted clock signal having a phase shift relative to the input clock signal that is a function of the current and future data signals, the phase shifted clock signal having a delay determined by the plurality of phase shift control signals, and the phase shifted clock signal being applied to data drivers in the read/write circuit to clock data onto the data bus.

38. The memory device of claim 37 wherein the memory device comprises a double data rate synchronous dynamic random access memory.

39. A computer system, comprising:
a data input device;
a data output device;
a processor coupled to the data input and output devices; and
a memory device coupled to the processor, the memory device comprising,
an address bus;
a control bus;
a data bus;
an address decoder coupled to the address bus;
a read/write circuit coupled to the data bus;
a control circuit coupled to the control bus;
a memory-cell array coupled to the address decoder, control circuit, and read/write circuit; and
a clock synchronization circuit adapted to receive an input clock and coupled to the read/write circuit to receive current data signals and respective future data signals, the clock synchronization circuit comprising:
a logic circuit coupled to receive the future data and current data signals, and operable to develop a plurality of phase shift control signals in response to the future data and current data signals; and
a phase shift circuit adapted to receive the input clock signal and coupled to the logic circuit to receive the plurality of phase shift control signals, and operable to generate a phase shifted clock signal having a phase shift relative to the input clock signal that is a function of the current and future data signals, the phase shifted clock signal having a delay determined by the plurality of phase shift control signals, and the phase shifted clock signal being applied to data drivers in the read/write circuit to clock data onto the data bus.

40. The computer system of claim 39 wherein the memory device comprises a double data rate synchronous dynamic random access memory.

41. A method of providing a plurality of data signals out of an integrated circuit in synchronism with a clock signal applied to the integrated circuit, the method comprising:
detecting a respective first logic state of each of the plurality of data signals;
detecting a respective second logic state of each of the plurality of data signals;
determining an output delay from the plurality of detected respective first and second logic states; and
adjusting a delay interval relative to a transition of the clock signal based on the determination by adding a first delay increment to the output delay for each corresponding pair of detected respective first and second logic state of each signal where the detected respective first and second logic states are equal, and adding a second delay increment to the output delay for each corresponding pair of detected respective first and second logic states of each data signal where the detected respective first and second logic state are unequal; and
outputting the plurality of data signals having the second logic state from the integrated circuit in response to the adjusted delay interval.

42. The method of claim 41 wherein the respective first logic state of each of the plurality of data signals comprises a current logic state and wherein the respective second logic state of each of the plurality of data signals comprises an upcoming logic state.

43. The method of claim 41 wherein the first delay increment is greater than the second delay increment.

44. A method of delaying a plurality of data signals relative to a clock signal, comprising:
detecting a respective current logic state of each of the plurality of data signals;
detecting a respective future logic state of each of the plurality of data signals;
determining an output delay having a value that is a function of the the plurality of detected respective current and future logic states for each data signal; and
delaying the plurality of data signals by the determined output delay relative to the clock signal by adding a first delay increment to the output delay for each corresponding pair of respective current and future logic states of each data signal where the detected respective current and future logic states are equal, and adding a second delay increment to the output delay for each corresponding pair of respective current and future logic states of each data signal where the detected respective current and future logic states are unequal.

45. The method of claim 44 wherein the first delay increment is greater than the second delay increment.

46. A method of providing a plurality of data signals out of an integrated circuit, the method comprising:
detecting respective current and future logic states for each of the plurality of data signals, the plurality of data signals having their respective current logic states having a phase shift relative to a clock signal;

adjusting the value of the phase shift as a function of a number of the plurality of data signals for which the values of their respective current and future logic states are equal and adjusting the value of the phase shift as a function of a number of the plurality of data signals for which their respective current and future logic states are unequal; and outputting the respective future logic state for each of the plurality of data signals, with each of the plurality of data signals having its respective future logic state being phase shifted by the adjusted value of the phase shift.

47. The method of claim 46 wherein adjusting the value of the phase shift as a function of the number of the plurality of data signals for which the values of their current and future logic states are unequal comprises decreasing a delay for each of the plurality of data signals for which the values of their current and future logic states are unequal.

48. The method of claim 47 wherein adjusting the value of the phase shift as a function of the number of the plurality of data signals for which the values of their current and future logic states are equal comprises increasing a delay for each the plurality of data signals for which the values of their current and future logic states are equal.

49. The method of claim 46 wherein adjusting the value of the phase shift as function of the number of the plurality of data signals for which the values of their current and future logic states are unequal comprises adding a first delay increment to the phase shift, and wherein adjusting the value of the phase shift as a function of the number of the plurality of data signals for which the values of their current and future logic states are equal comprises a second delay increment to the phase shift.

50. The method of claim 49 wherein the first delay increment is less than the second delay increment.

51. A method of providing a plurality of data signals out of an integrated circuit in synchronism with a clock signal applied to the integrated circuit, the method comprising:

detecting a respective current logic state of each of the plurality of data signals;

detecting a respective upcoming logic state of each of the plurality of data signals;

for each of the plurality of data signals, comparing their current and future logic states, and adjusting an output delay of the plurality of data signals as a function of the current and future logic states; and for each of the plurality of data signals, outputting the second logic states in accordance with the determination of the respective output delay.

52. The method of claim 51 wherein the plurality of data signals includes four data signals.

53. The method of claim 52 wherein adjusting the output delay of the plurality of data signals as a function of the current and future logic states of the plurality of data signals comprises adjusting the output delay to a first value when the current and future logic states of all data signals are equal, adjusting the output delay to a second value when the current and future logic states of one of the plurality of data signals is changing, adjusting the output delay to a third value when the current and future logic states of two of the plurality of data signals are changing, and adjusting the output delay to a fourth value when the current and future logic states of more than two of the plurality of data signals are changing.

54. The method of claim 53 wherein the first value is greater then the second value which is greater than the third value which is greater than the fourth value.

* * * * *